United States Patent
Youngblood

(10) Patent No.: US 7,075,370 B2
(45) Date of Patent: Jul. 11, 2006

(54) CMOS-CONFIGURED TRANSCONDUCTANCE AMPLIFIER CIRCUIT

(75) Inventor: Douglas L. Youngblood, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 44 days.

(21) Appl. No.: 10/910,704

(22) Filed: Aug. 3, 2004

(65) Prior Publication Data

US 2006/0028276 A1 Feb. 9, 2006

(51) Int. Cl.
*H03F 3/45* (2006.01)
*H03F 3/18* (2006.01)

(52) U.S. Cl. .................................... 330/255; 330/264

(58) Field of Classification Search ................ 330/255, 330/264
See application file for complete search history.

(56) References Cited

U.S. PATENT DOCUMENTS 5,585,763 A * 12/1996 Navabi et al. .............. 330/255
5,649,009 A    7/1997 Enriquez et al. ............ 379/399
6,411,163 B1   6/2002 Enriquez ..................... 330/257
6,717,470 B1 * 4/2004 Bowers ....................... 330/255

FOREIGN PATENT DOCUMENTS

JP    7-7337    1/1995
JP    8-18398   1/1996

* cited by examiner

*Primary Examiner*—Robert Pascal
*Assistant Examiner*—Alan Wong
(74) *Attorney, Agent, or Firm*—Allen, Dyer, Doppelt, Milbrath & Gilchrist, P.A.

(57) ABSTRACT

A CMOS-implemented transconductance amplifier has an input gain stage coupled to a CMOS output stage. The inverting input of the input gain stage is coupled to an input/output port to which an input voltage is coupled. The CMOS output stage has a first, transconductance CMOS transistor pair, whose source-drain paths are series-coupled between first and second outputs of the input stage. A second, transimpedance CMOS transistor pair have their source-drain paths series-coupled between first and second power supply terminals, and gate inputs coupled to outputs of the input stage. A third CMOS transistor pair is coupled in parallel with the second CMOS transistor pair to form a pair of current mirror stages. The current output is coupled to a common connection of the third CMOS pair.

12 Claims, 3 Drawing Sheets

CMOS-CONFIGURED TRANSCONDUCTANCE AMPLIFIER CIRCUIT

FIELD OF THE INVENTION

The present invention relates in general to communication systems and components, and is particularly directed to a CMOS transistor implementation of a transconductance amplifier circuit of the type described in the U.S. Pat. No. 6,411,163 to Enriquez (hereinafter referred to as the '163 patent), assigned to the assignee of the present application and the disclosure of which is incorporated herein. Such a transconductance amplifier is operative to transform a single ended input voltage into a very precise, single ended output current, in a manner that is effectively independent of respective voltage supply rails through which the amplifier circuit is powered, and which can be operated at a very low quiescent current. As a non-limiting example, the present invention may be readily employed to implement various circuit blocks of an audio circuit by means of a CMOS process, enabling it to enjoy substantially reduced noise and signal loss for interfacing audio communication signals with a telecommunication wireline pair.

BACKGROUND OF THE INVENTION

As discussed in the background section of the above-referenced '163 patent, a wide variety of electronic circuit applications employ one or more transconductance stages to generate output/drive currents that can be reasonably accurately controlled for delivery to one or more loads. As a non-limiting example, various equipments employed by telecommunication service providers contain what are known as 'SLIC's (subscriber line interface circuits), to interface (transmit and receive) telecommunication signals with respect to (tip and ring leads of) a (copper) wireline pair.

Because the length of the wireline pair can be expected to vary from installation to installation, and may have a very significant length (e.g., on the order of multiple miles), and the wireline pair transports both substantial DC voltages, as well as AC signals (e.g., voice and/or ringing), designing a SLIC that has 'universal' use in both legacy and state of the art installations continues to be a daunting task for the circuit designer.

In order to accommodate the above-referenced parameter variations in a telecommunication signalling environment, it is customary practice to configure the SLIC as a transconductance amplifier-based circuit, that produces a prescribed output current in response to an input voltage. One of the issues involved in using a transconductance amplifier circuit is the fact that it must not only deliver a very precisely controlled output current, but must do so irrespective of the voltages of the supply rails from which it is powered.

Prior to the invention disclosed in the '163 patent, conventional transconductance amplifier stages, whether they involved single ended architectures or differentially coupled transistor pairs (such as that those shown at Q1–Q2 in FIG. 1), usually suffered from the presence of one or more non-linearities associated with unequal or mismatched diode junctions in the components of the circuit generating a single ended output current.

One way to obviate this problem has been to employ a differentially balanced operational amplifier circuit architecture, such as that diagrammatically illustrated in FIG. 2. As shown therein, a pair of operational amplifiers A1 and A2 may be coupled to respective drive inputs (bases) of a pair of transistors Q1–Q2. Transistors Q1 and Q2 have their output (collector-emitter) current flow paths coupled in a differential configuration between a current mirror circuit M and negative feedback paths of the amplifiers A1 and A2, which terminate opposite ends of an impedance (resistance) Z. Although such a dual amplifier circuit design enables an output current to be precisely generated in terms of an applied input voltage, it does so at an increase in complexity and therefore device count, power and cost, and is constrained by the large signal bandwidth limitations of the operational amplifiers.

Auspiciously, the bipolar transistor-based transconductance amplifier disclosed in the above-referenced '163 patent effectively remedies shortcomings of such conventional transconductance amplifier circuit designs, by transforming a single ended input voltage (which may be a composite of plural input voltages) into a very precise, single ended output current, yet without requiring a substantial quiescent current, and in a manner that is effectively independent of (differential) voltage supply rails through which the circuit is powered.

The architecture of the bipolar transistor-based transconductance amplifier circuit of the '163 patent is schematically shown in FIG. 3 as including an operational amplifier 100 configured as a unity gain buffer. Amplifier 100 has a dual polarity input operational amplifier input and gain stage 110, and a low output impedance, single ended output stage 120. The input stage 110, which may have a conventional high impedance, moderate voltage gain circuit configuration, has a first, non-inverting polarity input 111, that is coupled to a DC reference voltage, shown as a voltage v1 (relative to ground (GND)), and a second, inverting polarity input 112, which is coupled to the output 123 of the amplifier's output stage 120 by way of a negative feedback path 126. The reference voltage v1 can be selected in compliance with the overhead voltages and power dissipation required by the specific application in which the transconductance amplifier circuit is employed.

The output stage 120 includes a differentially coupled bipolar transistor circuit pair, having a first, diode-connected NPN transistor 130, whose collector 131 and base 132 are connected in common to a first polarity output port 113 of the amplifier's input stage 110. The emitter 133 of transistor 130 is coupled in common to the emitter 143 of a second, diode-connected PNP transistor 140. In a complementary fashion, PNP transistor 140 has its collector 141 and base 142 connected in common to a second polarity output port 114 of the amplifier input stage 110. The base 132 of NPN transistor 130 is coupled in common with the base 152 of an NPN transistor 150, the emitter 153 of which is coupled in common to the emitter 163 of a PNP transistor 160 and to an input/output node 123 of output stage 120.

The PNP transistor 160 has its base 162 coupled in common with the base 142 of the PNP transistor 140. The output stage's input/output node 123 is coupled over negative feedback path 126 to the inverting input 112 of the input stage 110. As noted above, unlike a conventional amplifier circuit, the input/output node 123, rather than being employed to supply an output current to a downstream load, is coupled to receive one or more input currents, respectively supplied through one or more coupling resistors Z1, . . . ZN, to associated voltage feed ports 125-1, . . . , 125-N.

The series-connected, collector-emitter current paths through the output transistors 150 and 160 of output stage 120, rather than being biased via a direct coupling to respective (Vcc and Vee) voltage supply rails 155 and 165, are coupled in circuit with first current supply paths 171 and 181 of first and second bipolar transistor-implemented current mirror circuits 170 and 180, respectively. These current mirror circuits serve to isolate the biasing of the amplifier's output stage 120 from its power supply terminals, so that the output current produced at a single ended output port 135 can be accurately controlled independent of the values of the power supply voltages.

The current mirror circuit 170 includes a first PNP transistor 200 having its emitter 203 coupled to the (Vcc) voltage supply rail 155, and its base 202 coupled in common with the base 212 and collector 211 of a diode-connected current mirror PNP transistor 210, whose emitter 213 is coupled to (Vcc) voltage supply rail 155. The current mirror transistor 200 supplies a mirrored output current to the current supply path 172 as a prescribed factor K of the current received by transistor 210 over the current supply path 171, in accordance with the ratio (1:K) of the geometries of the transistors 210/200. The collector 211 and base 212 of transistor 210 are coupled over the first current supply path 171 of the current mirror 170 to the collector 151 of transistor 150 of output stage 120. The collector 201 of transistor 200 is coupled over a second current supply path 172 of the current mirror 170 to a transconductance stage output node 135.

In a complementary manner, current mirror circuit 180 includes a first NPN transistor 220 having its emitter 223 coupled to the (Vee) voltage supply rail 156 and its base 222 coupled in common with the base 232 and collector 231 of a diode-connected current mirror NPN transistor 230, whose emitter 233 is coupled to (Vee) voltage supply rail 156. The collector 231 and base 232 of the current mirror transistor 230 are coupled over the first current supply path 181 of current mirror 180 to collector 161 of output stage transistor 160. The collector 221 of transistor 220 is coupled over a second current supply path 182 of the current mirror 180 to the output node 135. The current mirror transistor 220 provides a mirrored output current to current supply path 182 as a factor K of the current received by transistor 230 over current supply path 181, in accordance with the (1:K) ratio of the geometries of transistors 230/220.

An examination of current node equations that define the transfer function of the bipolar process-based transconductance amplifier circuit of FIG. 3, reveals that it has a very wide dynamic range that not only accommodates multiple, differential polarity voltages applied at its voltage feed ports 125-1, . . . , 125-N, but enjoys very low quiescent power dissipation.

More particularly, the single ended output current $i_{123}$ delivered to input/output node 123 may be defined in equation (1) as:

$$i_{123} = (v_{125-1} - v_{111})/Z_1 + \ldots (v_{125-N} - v_{111})/Z_N \quad (1)$$

$$= \sum_{i=1}^{N} (v_{125-i} - v_{111})/Z_i$$

The currents $i_{171}$ and $i_{181}$ supplied to current mirrors 170 and 180 may be related to the current $i_{123}$ at the input/output node 123 by equation (2) as:

$$i_{123} + i_{171} = i_{181} \Longrightarrow i_{123} = i_{181} - i_{171} \quad (2)$$

The currents $i_{172}$ and $i_{182}$ supplied by current mirrors 170 and 180 may be related to the current $i_{135}$ at the output node 135 by equation (3):

$$i_{172} + i_{135} = i_{182} \quad (3)$$

and equation (4) as:

$$K i_{171} + i_{135} = K i_{181} \Longrightarrow i_{out} = i_{135} = K(i_{181} - i_{171}) = K i_{123} \quad (4)$$

Substituting equation (1) into equation (4) yields equation (5) as:

$$i_{out} = K \sum_{i=1}^{N} (v_{125-i} - v_{111})/Z_i \quad (5)$$

Implicit in equations (2) and (4) is the fact that transistor limitations due to beta and early voltage are compensated or minimized (in a manner not specifically shown in the diagrammatic illustration of FIG. 3). It may also be noted that if transistors 130/150 and 140/160 are matched pairs and the time average value of each of the input voltages applied to the voltage input terminals 125-1, . . . , 125-N is equal to v1, and v1 is a DC voltage, then the time average values of currents $i_{171}$ and $i_{181}$ are equal to the DC bias current $I_{DC}$ flowing in the emitter path of the output stage transistors 130-140. Therefore, if the value of the bias current $I_{DC}$ is relatively low and the current mirror ratio K is equal to or less than 1, the quiescent power consumed by the transconductance amplifier circuit of FIG. 3 can be reduced to a very small value.

As further described in the '163 patent, a particularly useful application of the transconductance amplifier circuit of FIG. 3 is as a building block for one or more subcircuits employed within a subscriber line interface circuit, or SLIC, for interfacing communication signals supplied from a device such as a modem, with a wireline pair for delivery to a remote circuit, such as a subscriber's telephone. To this end, the front end of the SLIC's receiver channel circuit has a transconductance circuit that incorporates the amplifier of FIG. 3 as its basic building block. It also includes a pair of auxiliary current mirror circuits, which are cross-coupled with the current mirror circuits 170 and 180 of the transconductance amplifier of FIG. 3.

The current node relationships associated with this cross-coupling of these auxiliary current mirror circuits with current mirror circuits 170 and 180 are such that the auxiliary current mirror circuits supply to an additional output port the same precision output current, but in an opposite current flow directional sense, that is provided at the output port of the transconductance amplifier of FIG. 3. These two opposite polarity current output ports are applied through respective 'tip' and 'ring' output amplifiers, which are coupled in a voltage follower configuration to respective tip and ring output ports for application to a (telephone) wireline pair being driven by the receiver channel circuit. For additional details of the incorporation and operation of the transconductance amplifier of FIG. 30 in SLIC applications, attention may be directed to the '163 patent.

SUMMARY OF THE INVENTION

Now although the transconductance amplifier of the '163 patent, and shown in FIG. 3, described above, provides a substantial improvement over the prior art, it is effectively a bipolar transistor implementation. It would be desirable to configure a like transconductance amplifier that enjoys all of the functionality and performance described in the '163 patent, but which is implemented using CMOS processing technology. One way to do this would be to simply make a one-for-one substitution of the bipolar transistors of FIG. 3 with corresponding polarity field effect transistors. Indeed, the use of field effect devices as alternative equivalents is described in the '163 patent.

Analysis by the present inventor has revealed, however, that a substantially improved CMOS implementation of the transconductance amplifier of the '163 patent can be obtained using a different circuit configuration for the operational amplifier's output stage. As will be detailed below, this new output stage configuration provides the dual functionality of that stage, as well as the current mirror circuitry to which the output stage is normally coupled (in the bipolar design). This means that fewer transistors are required, so that the present invention enjoys a very high degree of circuit area integration. This makes the present invention especially attractive for hybrid CMOS signal processing architectures, which contain both analog and digital components.

To this end, similar to the front end unity gain buffer of the transconductance circuit of FIG. 3, described above, the CMOS process-based transconductance circuit of the present invention comprises a front end operational amplifier configured as a dual polarity, high impedance, unity gain buffer. This buffer has a pair of outputs coupled to a low output impedance, output stage. Like the transconductance circuit of FIG. 3, the input stage has a first, non-inverting (+) polarity input coupled to a DC reference voltage, and a second, inverting (−) polarity input coupled via a negative feedback link to an input/output node of the transconductance amplifier's output stage.

Also, like the input/output node 123 in the bipolar circuit implementation of FIG. 3, a summing input/output node of the transconductance amplifier of the invention may be coupled to receive one or more input currents, respectively supplied through one or more coupling resistors from associated voltage feed ports. As in the circuit of FIG. 3, the reference voltage may be readily selected in compliance with the overhead voltages and power dissipation required by the specific application in which the transconductance amplifier circuit is employed.

Unlike the output stage of the bipolar embodiment of FIG. 3, which contains a differentially coupled bipolar transistor circuit pair, the output stage of the transconductance amplifier of the invention is comprised of a CMOS-based transimpedance circuit followed by a CMOS-based transconductance stage. The CMOS-based transimpedance circuit contains a first pair of CMOS transistors—a PMOS transistor and an NMOS transistor. These complementary polarity MOS transistors have their source-drain paths coupled in series with the outputs of operational amplifier's input stage, while their gates are coupled to associated gate bias voltages. The gate bias voltages serve to control the DC quiescent current of the CMOS transconductance stage.

The amplifier's output stage further includes a CMOS-based transconductance circuit, comprised of a first, PMOS transistor and a second, NMOS transistor, which have their source-drain paths coupled in series between a pair of power supply rails. A common connection in the source-drain paths of these transistor is coupled to the input/output node of the amplifier's output stage, which is fed back to the inverting (−) input of the amplifier's input stage as described above. The PMOS transistor of the CMOS transconductance circuit has its gate coupled to one output of the operational amplifier's input stage, while the NMOS transistor of the CMOS transconductance circuit has its gate coupled to the other output of the operational amplifier's input stage.

The PMOS transistor of the CMOS-based transconductance circuit has an associated current mirror PMOS transistor, while the NMOS transistor of the CMOS-based transconductance circuit has an associated current mirror NMOS. This is unlike the bipolar architecture of FIG. 3, wherein transistors 150 and 160 of the amplifier's output stage 120 are respectively coupled to separate input transistors 210 and 230 of current mirror stages 170 and 180. Namely, the CMOS transconductance circuit architecture of the present invention has two less transistors than the bipolar circuit architecture of FIG. 3.

The PMOS current mirror transistor has its gate coupled to the output port of the unity gain amplifier input stage, while the NMOS current mirror transistor has its gate coupled to the output port of the unity gain amplifier input stage. The current mirror transistors have their source-drain paths coupled in series between the power supply rails, while a common connection therebetween is coupled to a current output port.

Like the bipolar transistor-configured architecture of FIG. 3, the CMOS-based transconductance amplifier circuit of the invention has a very wide dynamic range at very low quiescent power dissipation, that accommodates the coupling of multiple, differential polarity voltages through associated resistors coupled to multiple voltage feed ports.

As in the case of the bipolar implementation of the transconductance amplifier of FIG. 3, the CMOS process-based transconductance amplifier of the invention is operative to perform a very accurate and linear voltage-to-current conversion of an input voltage by the use of a very accurate input resistor. Such an input resistor may be readily obtained by way of current integrated circuit manufacturing processes that typically provide either a poly or thin film resistor that has very linear characteristics of the operational signal range.

DETAILED DESCRIPTION

Figure 1:
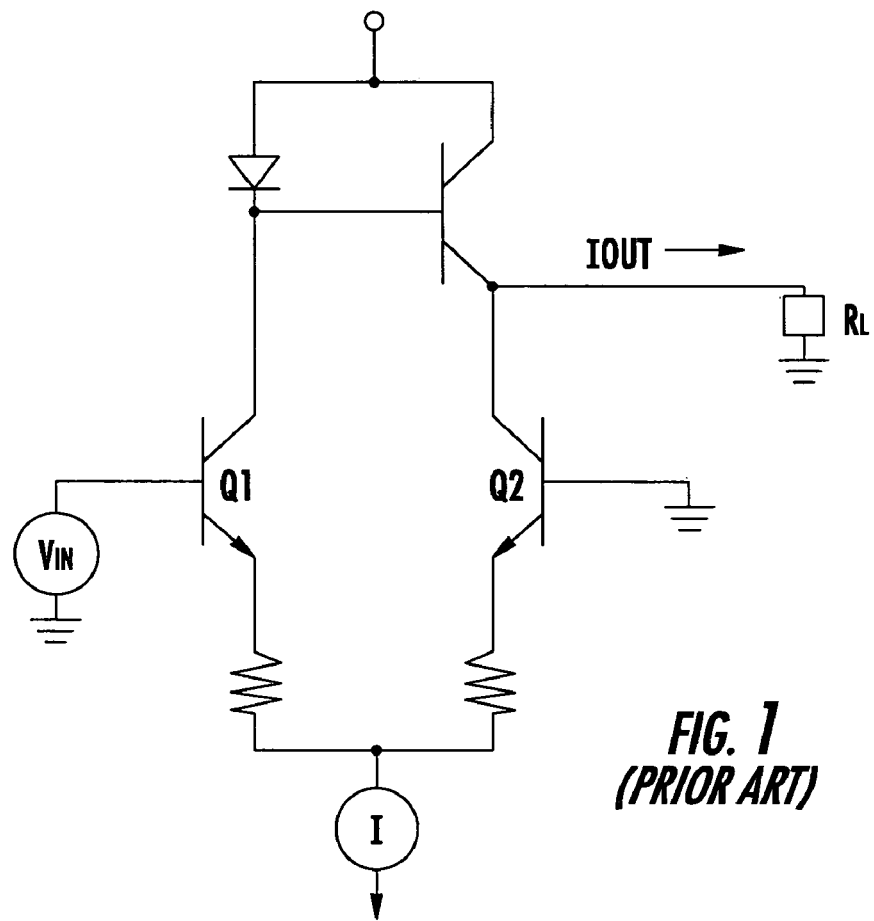
FIG. 1 shows a conventional transconductance amplifier stage employing differentially coupled transistor pairs.
Figure 2:
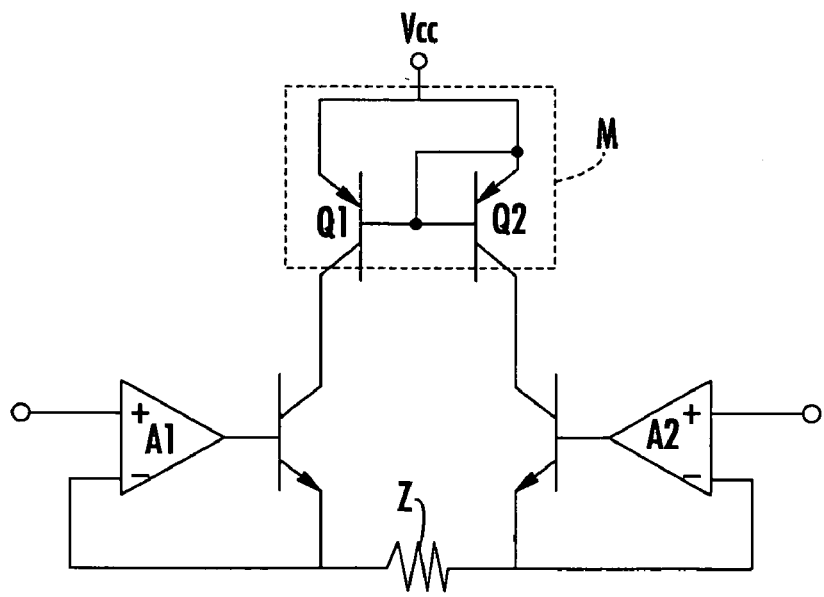
FIG. 2 diagrammatically illustrates a conventional differentially balanced operational amplifier circuit.
Figure 3:
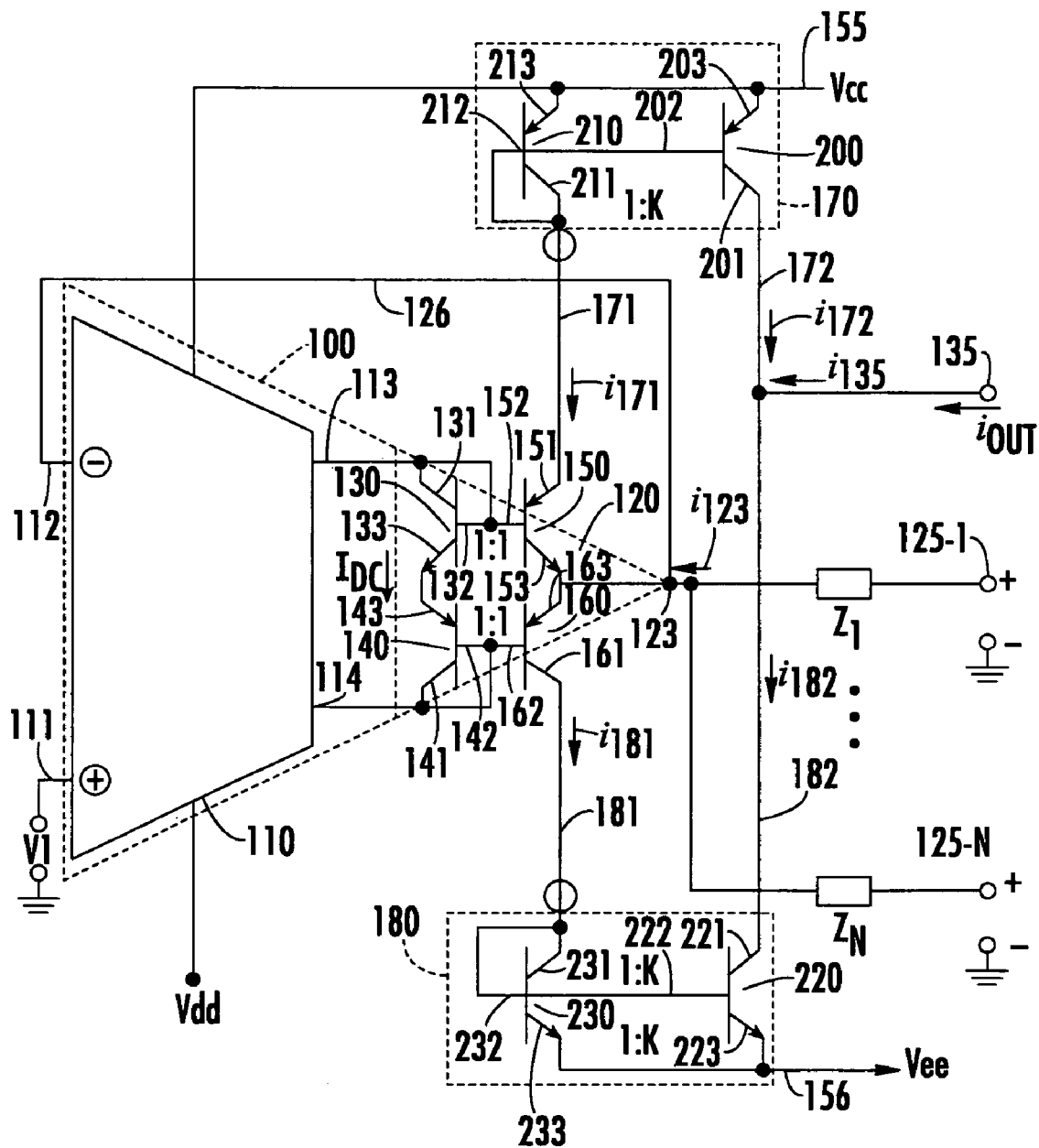
FIG. 3 shows the circuit configuration of the bipolar transistor-implemented transconductance amplifier circuit of the above-referenced '163 patent.
Figure 4:
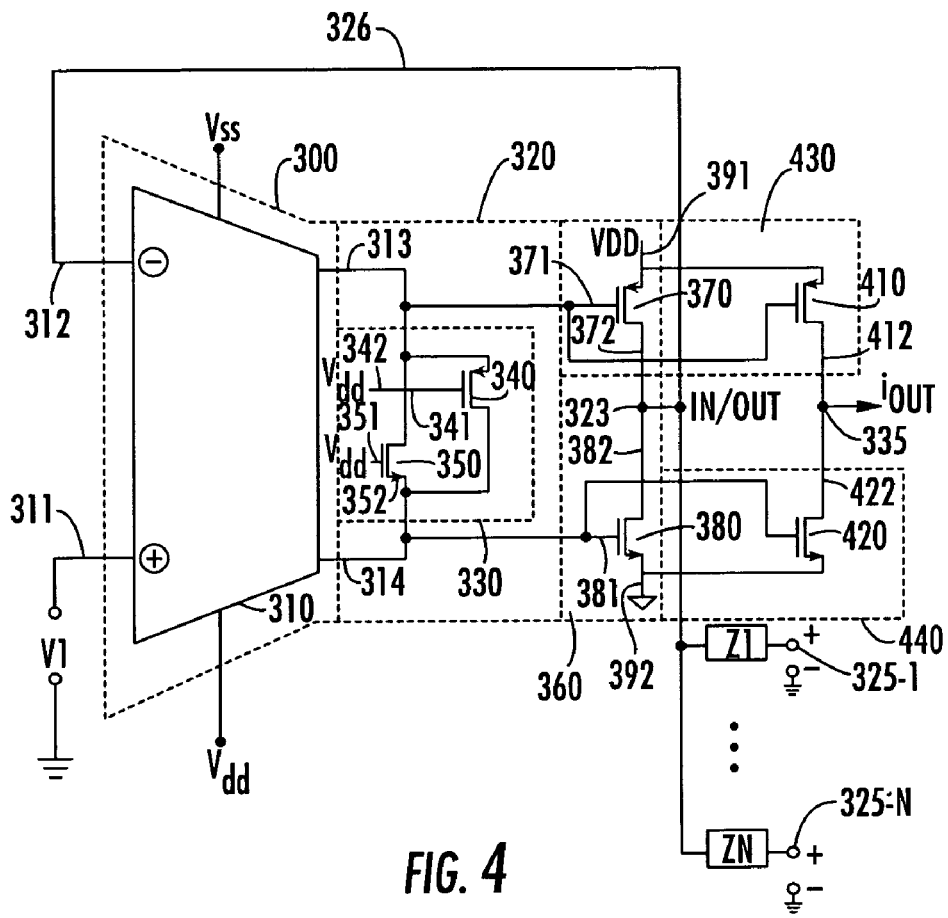
FIG. 4 shows the circuit configuration of a CMOS transistor-implemented transconductance amplifier circuit according to the present invention.

Attention is now directed to FIG. 4, wherein the circuit architecture of a CMOS-based transconductance amplifier circuit in accordance with the invention is schematically illustrated as comprising a front end operational amplifier 300 configured as a unity gain buffer. Like the amplifier 100 of FIG. 3, described previously, amplifier 300 is comprised of a dual polarity input, high input impedance, operational amplifier input gain stage 310, followed by a low output impedance, single ended output stage 320.

Input stage 310 has a first, non-inverting (+) polarity input 311 coupled to a DC reference voltage, shown as a voltage v1 (relative to ground (GND)), and a second, inverting (−) polarity input 312 coupled via a negative feedback link 326 to an input/output node 323 of the amplifier's output stage 320. Like input/output node 123 in the bipolar circuit implementation of FIG. 3, the input/output node 323 of FIG. 4 is coupled to receive one or more input currents, respectively supplied through one or more respective coupling resistors Z1, . . . ZN, to associated voltage feed ports 325-1, . . . , 325-N. Input stage 310 has a first output 313 and a second output 314. As in the circuit of FIG. 3, the reference voltage v1 may be readily selected in compliance with the overhead voltages and power dissipation required by the specific application in which the transconductance amplifier circuit is employed.

Unlike the output stage of the bipolar embodiment of FIG. 3, which contains a differentially coupled bipolar transistor circuit pair, the output stage 320 of the amplifier 300 of FIG. 4 includes a CMOS transimpedance circuit 330 that is comprised of a first, PMOS transistor 340 and a second, NMOS transistor 350. These two CMOS transistors have their source-drain paths coupled in series between the outputs 313 and 314 of amplifier output stage 320. PMOS transistor 340 has its gate 341 coupled to a gate bias voltage 342, while PMOS transistor 350 has its gate 351 coupled to a gate bias voltage 352.

The amplifier's output stage 320 further includes a CMOS transconductance circuit 360, comprised of a first, PMOS transistor 370 and a second, NMOS transistor 380. Transistors 370 and 380 have their source-drain paths coupled in series between power supply rail 391 (VDD) and power supply rail 392 (ground), while a common connection therebetween is coupled to the input/output node 323 of the amplifier's output stage 320 (which is fed back to the inverting (−) input 312 of the amplifier input stage 310 as described above). PMOS transistor 370 has its gate 371 coupled to the output 313 of amplifier input stage 310, while NMOS transistor 380 has its gate 381 coupled to output 314 of amplifier input stage 310. The gate bias voltages 351 and 352 are used to control the DC quiescent current in output transistors 370 and 380.

PMOS transistor 370 has an associated current mirror transistor 410, 50 that transistors 370 and 410 form a PMOS current mirror stage 430, while NMOS transistor 380 has an associated current mirror transistor 420, so as to form an NMOS current mirror stage 440. This is unlike the bipolar architecture of FIG. 3, wherein bipolar transistors 150 and 160 of the amplifier's output stage 120 are respectively coupled to separate input bipolar transistors 210 and 230 of current mirror stages 170 and 180. Namely, the CMOS circuit architecture of FIG. 4 requires two less transistors than the bipolar circuit architecture of FIG. 3, as the transistors 370 and 380 of the CMOS circuit architecture of FIG. 4 simultaneously serve as output transistors of the amplifier output stage 320 and input transistors of current mirror stages 430 and 440, respectively.

PMOS current mirror transistor 410 has its gate 411 coupled in common with gate 371 of PMOS transistor 370, namely, to the output port 313 of amplifier input stage 310, while the NMOS current mirror transistor 420 has its gate 421 coupled in common with the gate 381 of NMOS transistor 380, namely, to the other output port 314 of amplifier input stage 310. Current mirror transistors 410 and 420 have their source-drain paths coupled in series between power supply rail 391 (VDD) and power supply rail 392 (ground), while a common connection therebetween is coupled to an (IOUT) output port 335.

Current mirror transistor 410 supplies a mirrored output current to a current output path 412 as a prescribed factor K of the current received by transistor 370 over a current supply path 372, in accordance with the ratio (1:K) of the geometries of the transistors 370/410, while current mirror transistor 420 supplies a mirrored output current to a current output path 422 as a prescribed factor K of the current received by transistor 380 over a current supply path 382, in accordance with the ratio (1:K) of the geometries of the transistors 380/420.

Like the bipolar transistor-configured architecture of FIG. 3, the CMOS-based transconductance amplifier circuit of FIG. 4 has a very wide dynamic range at very low quiescent power dissipation, that accommodates multiple, differential polarity voltages coupled to voltage feed ports 325-1, . . . , 325-N.

The currents $i_{372}$ and $i_{382}$ respectively supplied to current mirrors 430 and 440 may be related to the current $i_{323}$ at the input/output node 323 by equation (6) as:

$$i_{323}+i_{372}=i_{382}==>i_{323}=i_{382}-i_{372} \quad (6)$$

The currents $i_{412}$ and $i_{422}$ supplied by current mirrors 430 and 440 may be related to the current $i_{335}$ at the output node 335 by equation (7):

$$i_{412}+i_{335}=i_{422} \quad (7)$$

and equation (8) as:

$$Ki_{372}+i_{335}=Ki_{382}=>i_{out}=i_{335}=K(i_{382}-i_{372})=Ki_{323} \quad (8)$$

Rewriting equation (8) to accommodate multiple inputs at input terminals 325-1, . . . , 325-N yields equation (9) as:

$$i_{out} = K\sum_{i=1}^{N}(v_{325-i}-v_{311})/Z_i \quad (9)$$

As in the case of the bipolar implementation of the transconductance amplifier of FIG. 3, the CMOS process-based transconductance amplifier of FIG. 4 is operative to perform a very accurate and linear voltage-to-current conversion of an input voltage by the use of a very accurate input resistor. Such an input resistor may be realized using presently commercially available integrated circuit manufacturing processes that typically provide either a poly or thin film resistor that has very linear characteristics of the operational signal range.

Figure 5:
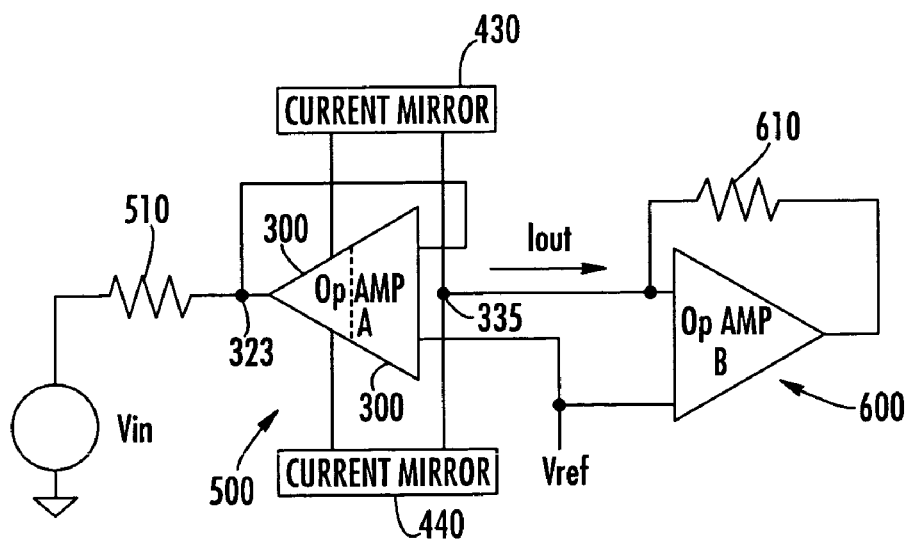
FIG. 5 diagrammatically illustrates the CMOS transconductance amplifier of FIG. 4 coupled in cascade with a downstream transimpedance amplifier.

As diagrammatically illustrated in the more generalized form in FIG. 5, the output of the CMOS-based transconductance amplifier of FIG. 4, shown at 500, may be coupled to the input of a transimpedance amplifier 600, which uses a feedback resistor 610 of the same type as and circuit layout-wise generally co-located with input resistor 510 for transconductance amplifier 500, allowing the characteristics of the two resistors to be very closely matched, for substantially enhanced performance of the transconductance—transimpedance transfer function. In this circuit the effective gain through transconductance amplifier circuit 500 and transimpedance amplifier stage 600 is established by the ratio of the feedback resistor 610 of the transimpedance amplifier stage to the input resistor 510 of the transconductance amplifier stage.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A transconductance amplifier circuit comprising an operational amplifier having a dual polarity input gain stage coupled in cascade with an output stage, said dual polarity input gain stage having a first, non-inverting input to which a reference voltage is applied, and a second, inverting input, coupled over a feedback path to an input/output port of said output stage to which an input voltage is coupled, and first and second outputs, said output stage having a transimpedance circuit containing a first CMOS transistor pair having source-drain paths thereof coupled in series between said first and second outputs of said input stage, and gate inputs thereof coupled to receive prescribed DC voltages, and a transconductance circuit containing a second CMOS transistor pair having source-drain paths thereof coupled in series between first and second power supply terminals, and gate inputs thereof coupled to said first and second outputs of said input stage, and a third CMOS transistor pair coupled in parallel with said second CMOS transistor pair and forming therewith a pair of current mirror stages, and wherein a current output port of said transconductance amplifier circuit is coupled to a common connection of said third CMOS pair in the source-drain paths thereof.

2. The transconductance amplifier circuit according to claim 1, wherein said input/output port is coupled to a common connection of second CMOS transistor pair in the source-drain paths thereof.

3. The transconductance amplifier circuit according to claim 2, wherein said current output port is further coupled to an input of a downstream transimpedance amplifier.

4. The transconductance amplifier circuit according to claim 3, wherein said downstream transimpedance amplifier has a prescribed feedback resistor coupled between said input of said downstream transimpedance amplifier and an output thereof.

5. The transconductance amplifier circuit according to claim 4, wherein an input voltage is coupled through an input resistor to said input/output port, and wherein the effective gain through said transconductance amplifier circuit and said downstream transimpedance amplifier is established by the ratio of said feedback resistor to said input resistor.

6. An apparatus comprising:
a transconductance amplifier circuit comprised of an operational amplifier having a dual polarity input gain stage coupled in cascade with an output stage, said dual polarity input gain stage having a first, non-inverting input adapted to be coupled to a reference voltage, and a second, inverting input, coupled over a feedback path to an input/output port, and first and second outputs, said input/output port being coupled to a voltage input source through an input resistor, said output stage comprising a transimpedance circuit containing a first CMOS transistor pair having source-drain paths thereof coupled in series between said first and second outputs of said input stage, and gate inputs thereof coupled to receive prescribed DC voltages, and a transconductance circuit containing a second CMOS transistor pair having source-drain paths thereof coupled in series between first and second power supply terminals, and gate inputs thereof coupled to said first and second outputs of said input stage, and a third CMOS transistor pair coupled in parallel with said second CMOS transistor pair and forming therewith a pair of current mirror stages, and wherein a current output port of said transconductance amplifier circuit is coupled to a common connection of said third CMOS pair in the source-drain paths thereof; and
a transimpedance amplifier stage having an input coupled said output of said ransconductance amplifier circuit, and a feedback resistor coupled between an output of said transimpedance amplifier stage and said input thereof.

7. The apparatus according to claim 6, wherein the effective gain of said apparatus through said transconductance amplifier circuit and said transimpedance amplifier stage is established by the ratio of said feedback resistor to said input resistor.

8. An output circuit for a transconductance amplifier circuit having a dual polarity input and gain stage, which includes a first, non-inverting input to which a reference voltage is applied, and a second, inverting input, and first and second outputs, said output circuit comprising a transimpedance circuit containing a first CMOS transistor pair having source-drain paths thereof coupled in series with said first and second outputs of said input and gain stage, and gate inputs thereof coupled to receive prescribed DC voltages, and a transconductance circuit containing a second CMOS transistor pair having source-drain paths thereof coupled in series between first and second power supply terminals, and gate inputs thereof coupled to said first and second outputs of said input and gain stage, and wherein an input/output port of said transconductance amplifier circuit is coupled to a common connection of said second CMOS transistor pair, and is further coupled by way of a feedback link from said common connection of said second CMOS transistor pair to said second, inverting input of said input and gain stage.

9. The output circuit according to claim 8, further comprising a third CMOS transistor pair coupled in parallel with said second CMOS transistor pair and forming therewith a pair of current mirror stages, and wherein a current output port of said transconductance amplifier circuit is coupled to a common connection of said third CMOS pair in the source-drain paths thereof.

10. The output circuit according to claim 9, wherein said current output port of said transconductance amplifier circuit is further coupled to an input of a downstream transimpedance amplifier.

11. The output circuit according to claim 9, said downstream transimpedance amplifier has a prescribed feedback resistor coupled between said input of said downstream transimpedance amplifier and an output thereof.

12. The output circuit according to claim 11, wherein an input voltage is coupled through an input resistor to said input/output port of said transconductance amplifier circuit, and wherein the effective gain through said transconductance amplifier circuit and said downstream transimpedance amplifier is established by the ratio of said feedback resistor to said input resistor.

* * * * *